United States Patent [19]

Lenoski et al.

[11] Patent Number: 4,780,874
[45] Date of Patent: Oct. 25, 1988

[54] DIAGNOSTIC APPARATUS FOR A DATA PROCESSING SYSTEM

[75] Inventors: Daniel E. Lenoski, Mountain View; David J. Garcia, San Jose, both of Calif.

[73] Assignee: Tandem Computers Incorporated, Cupertino, Calif.

[21] Appl. No.: 40,466

[22] Filed: Apr. 20, 1987

[51] Int. Cl.$^4$ .......................................... G01R 31/28
[52] U.S. Cl. ..................................... 371/25; 324/73 R
[58] Field of Search ................... 371/15, 25; 324/73 R

[56]  References Cited

U.S. PATENT DOCUMENTS

| 4,509,008 | 4/1985 | DasGupta et al. | 324/73 R |
| 4,513,418 | 4/1985 | Bardell, Jr. et al. | 371/25 |
| 4,519,078 | 5/1985 | Komonytsky | 371/25 |
| 4,649,539 | 3/1987 | Crain et al. | 371/25 |
| 4,698,588 | 10/1987 | Hwang et al. | 324/73 R |
| 4,710,933 | 12/1987 | Powell et al. | 371/25 |
| 4,718,065 | 1/1988 | Boyle et al. | 371/25 |

Primary Examiner—Jerry Smith
Assistant Examiner—Clark A. Jablon
Attorney, Agent, or Firm—Townsend and Townsend

[57] ABSTRACT

A level sensitive scan design (LSSD) diagnostic apparatus for a data processing component. Each scan unit in a shift register chain comprises a plurality of level sensitive elements, e.g., data latches, which transfer signals from their input terminals to their output terminals in response to a "Phase B" pulse train. A multiplexer is connected to each data latch for communicating run data to the input terminal of each data latch in a normal mode of operation. In test mode, the multiplexer communicates signals from the output terminal of one data latch to the input terminal of an adjacent data latch, so that the data latch signals are serially communicated through the resulting latch chain.

In order to prevent the test data from propagating uncontrollably through the serially connected latches, each multiplexer includes a test latch disposed between the test data input of the multiplexer and the output terminal of the preceding data latch in the chain. The test latch is controlled by a "Phase A" pulse train signal which is interleaved with the phase B pulse train.

26 Claims, 9 Drawing Sheets

DIAGNOSTIC APPARATUS FOR A DATA PROCESSING SYSTEM

BACKGROUND OF THE INVENTION

1. Field of the Invention

The present invention relates to a diagnostic apparatus for a data processing system and, more particularly, to a chip level diagnostic apparatus incorporating a scan design into a latch-based system.

2. Description of the Relevant Art

In the past, digital circuits contained within an IC chip were tested manually because access to individual components was possible. As time progressed, the number of devices per chip increased, causing a corresponding decrease in the ratio of the number of IC pins to the number of components on the chip. As a result, access to individual devices became more difficult, if not impossible.

As testing and maintenance costs increased beyond acceptable limits, designers attempted to enhance the observability and controllability of each chip to facilitate testing. Observability refers to the ease with which the state of internal signals can be determined. Controllability refers to the ease of producing a specific internal signal value. The most direct way to increase the observability or controllability of a circuit design is to introduce test points, or additional circuit inputs and outputs, into the chip for use during testing. For circuit boards, the cost of test points is often well justified. On the other hand, the cost of test points for ICs can be prohibitive because of IC pin limitations. Consequently, techniques have evolved which use scan paths to permit access to the internal nodes of a circuit without requiring a separate external connection for each node accessed.

In the scan path technique, a circuit is designed so that it has two modes of operation: one that is the normal functional mode, and the other that is a test mode in which circuit memory (storage) elements, typically combinational circuitry input and output storage elements, are interconnected into a shift register chain for forming scan units associated with each set of combinational logic. With the circuit in a test mode, it is possible to shift an arbitrary test pattern into the input elements. By returning the circuit to a normal mode for one clock period, the combinational circuitry can act upon the shift register contents and then store the results in the output elements. If the circuit is then placed into a test mode, it is possible to shift out the contents of the shift register and compare the contents with the correct response.

One way of implementing a scan path is to interconnect the circuit flip-flops to form a shift register. An important characteristic of flip-flops is that a shift register can be constructed by connecting the output of one flip-flop directly to the data input of the next flip-flop. Unfortunately, flip-flop based scan paths are not efficient or not easy to implement in some technologies, e.g., MOS technology, and there are circumstances when the system must be run using multiple non-overlapping pulse trains. Furthermore, scan paths utilizing flip-flops are sensitive to variations in the clocking signal and hence require careful consideration of clock skew, signal propagation time, and other hardware factors which may be extremely difficult to control.

Another scan path technique uses level sensitive elements, e.g., latches, rather than flip-flops, as the shift register elements. An example of the technique is "level sensitive scan design" (LSSD), used by IBM. Unfortunately, it is not possible to reconfigure system latches directly into a shift register for test purposes. Instead, the conversion of a latch register into a shift register requires converting each latch into a specialized dual input latch and placing an extra latch between each register stage. The resulting structure requires three clocks to operate, and each clock must be carefully controlled and operated at different times, depending on whether the system is in normal or test mode. The controlling logic adds to clock skew.

The following publications discuss techniques of Level Sensitive Scan Design and are considered relevant to the present invention. They are incorporated herein by reference. Donald Komonytsky, "LSI Self Test Using Level Sensitive Scan Design and Signature Analysis," 1982 *IEEE Test Conference*, Paper 14.3; E.B. Eichelberger, T.W. Williams, "A Logic Design Structure For LSI Testability," #14 *Design Automation Conference*, 1977; T.W. Williams, "Design for Testability—A Survey," *IEEE Transactions on Computers*, Vol. C-31, No. 1, January 1982; Konemann, Mucha & Zwiehoff, "Built-In Test for Complex Digital Integrated Circuits," *IEEE Journal of Solid State Circuits*, Vol. SC-15, No. 3, June 1980; E. J. McCluskey, "A Survey of Design for Testability Scan Techniques," *VLSI System Design Magazine*, Semicustom Design Guide, Summer 1986.

SUMMARY OF THE INVENTION

The present invention is directed to a level sensitive diagnostic apparatus for a data processing component. The diagnostic apparatus requires only two free-running, non-overlapping clocks, and it may be controlled by software based enabling signals. In one embodiment of the present invention, each scan unit in a shift register chain comprises a plurality of level sensitive elements, e.g., data latches, which transfer signals from their input terminals to their output terminals in response to a "Phase B" pulse train. A multiplexer is connected to each data latch for communicating run data to the input terminal of each data latch in a normal mode of operation. In test mode, the multiplexer communicates signals from the output terminal of one data latch to the input terminal of an adjacent data latch, so that the data latch signals are serially communicated through the resulting latch chain. The first latch in the series is connected to a test data input, and the last latch in the series is connected to a test data output.

In order to prevent the test data from propagating uncontrollably through the serially connected latches, each multiplexer includes a test latch disposed between the test data input of the multiplexer and the output terminal of the preceding data latch in the chain. The test latch is controlled by a "Phase A" pulse train signal which is interleaved with but does not overlap the phase B pulse train, and each phase A positive pulse alternates with each phase B pulse. For controlling the multiplexers, a scan enable signal is connected to each multiplexer through a select latch for ensuring that the multiplexers operate synchronously with the test data appearing on the multiplexer inputs. For maintaining the existing values at the output terminals of each data latch when desired, a FREEZE signal is connected to the enable terminal of each run data latch through a freeze latch.

DETAILED DESCRIPTION OF THE PREFERRED EMBODIMENT

Figure 1:
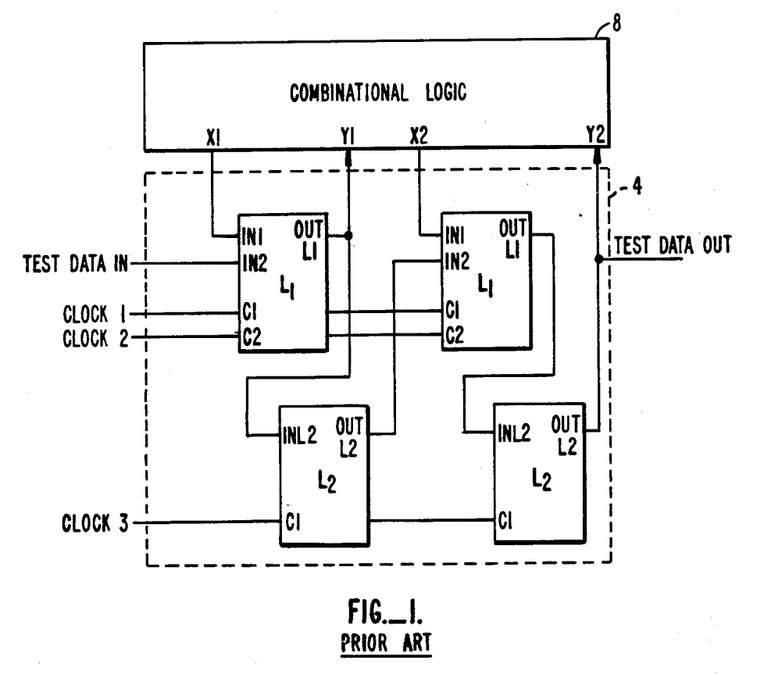
FIG. 1 is a block diagram of a prior art diagnostic apparatus incorporating a level sensitive scan design.

FIG. 1 is a block diagram illustrating a level sensitive scan design described by E. G. Eichelberger and P. W. Williams in a paper entitled "A Logic Design Structure For LSI Testability," appearing at No. 14, *Design Automation Conference*, 1977. As shown in FIG. 1, a level sensitive scan unit 4 is connected to a portion of combinational logic 8 at terminals X1, Y1, X2, and Y2. Combinational logic 8 may comprise one or more logic arrays located within a CPU, controller, or other data processing element. Terminals X1 and X2 may be output terminals from one set of logic arrays, and terminals Y1 and Y2 may be input terminals to a second logic array. Without level sensitive scan unit 4, data ordinarily flows through conventional input latches from terminal X1 to terminal Y, and from terminal X2 to terminal Y2.

Level sensitive scan unit 4 comprises a plurality of latches L1 and L2. Latches L1 communicate data appearing at either input terminal IN1 or IN2 to output terminal OUTL1 in response to clock signals CLOCK1 or CLOCK2 appearing at terminals C1 and C2, respectively. During the normal operation of combinational logic 8, latches L1 transfer data from terminal INL1 to terminal OUTL1 in response to the CLOCK1 signal. When in test mode, latches L1 transfer the test data from terminal IN2 to terminal OUTL1 in response to CLOCK2. Because latches cannot be directly connected to each other for forming shift registers, an extra latch L2 is disposed between the OUTL1 terminal of a preceding latch L1 and the input terminal IN2 of a succeeding latch L1. Latches L2 transfer data from terminal INL2 to OUTL2 in response to a clock signal CLOCK3. Accordingly, in test mode, data is shifted through level sensitive scan unit 4 by applying test data to the initial latch L1 and by alternately pulsing the CLOCK2 and CLOCK3 signals. The system thus requires three clocks which must be stopped and started at different times depending on the function desired.

Figure 2:
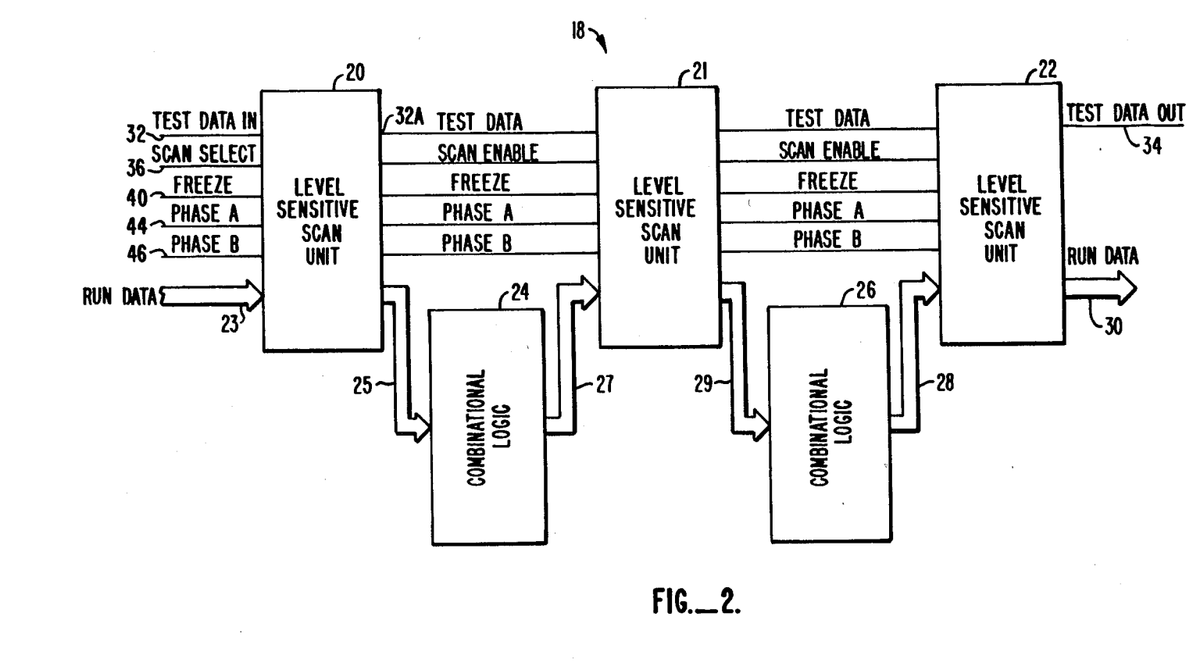
FIG. 2 is a block diagram of a level sensitive scan unit according to the present invention disposed between two sets of combinational logic.
Figure 3:
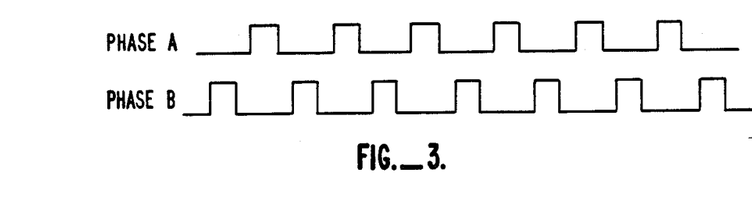
FIG. 3 is a diagram illustrating timing pulses used with the present invention.

FIG. 2 is a block diagram of a scan chain 18 formed from a plurality of interconnected level sensitive scan units 20, 21, and 22 according to the present invention. During normal operation, scan unit 20 receives primary input run data over a parallel data bus 23 and communicates the run data to combinational logic 24 over a parallel data bus 25. Scan units 21 and 22 receive run data from combinational logic 24 and 26 over parallel data buses 27 and 28, and they communicate the run data so received to combinational logic 26 over a parallel data bus 29 and to an output bus 30, respectively. In test mode, test data is input to scan chain 18 on a line 32, and scan units 20, 21, and 22 serially shift the test data through scan chain 18 until the test data appears on buses 25 and 29 for processing by combinational logic 24 and 26, respectively. After each combinational logic section has performed its operation on the test data, the results are loaded into scan units 21 and 22 and then serially shifted out through a test data output line 34. Operation of each scan unit 20, 21, and 22 is controlled by a scan select signal received on a line 36, a FREEZE signal received on a line 40, and two free-running, interleaved, non-overlapping CLOCK pulse trains, labeled "PHASE A" and "PHASE B," received on lines 44 and 46, respectively. The format of PHASE A and PHASE B are illustrated in FIG. 3. The present invention eliminates the requirement of a third clock, and clocks A and B need not be designed for intermittent operation.

Figure 4:
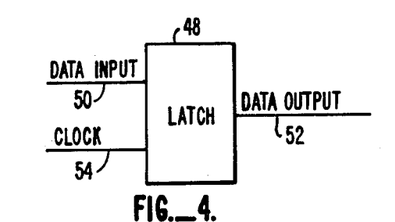
FIG. 4 is a block diagram of a conventional latch used in constructing the present invention.
Figure 5:
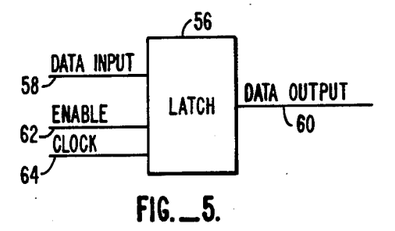
FIG. 5 is a block diagram of a freezable latch used in constructing the present invention.

FIGS. 4 and 5 illustrate the basic level sensitive devices, e.g., latches, used to implement a level sensitive scan unit according to the present invention. The latch illustrated in FIG. 4 is a conventional latch wherein data received on a data input line 50 is communicated to a data output line 52 whenever a signal appearing on a clock line 54 is at a prescribed level, e.g., high. FIG. 5 illustrates a freezable latch 56 which communicates data on a data input line 58 to a data output line 60 whenever signals appearing on both an enable line 62 and a clock line 64 are at a prescribed level. Accordingly, line 62 may act as a control line which inhibits signal loading of latch 56 and maintains the existing signal on line 60, irrespective of the signal on line 64. Both latches are of well known construction.

Figure 6:
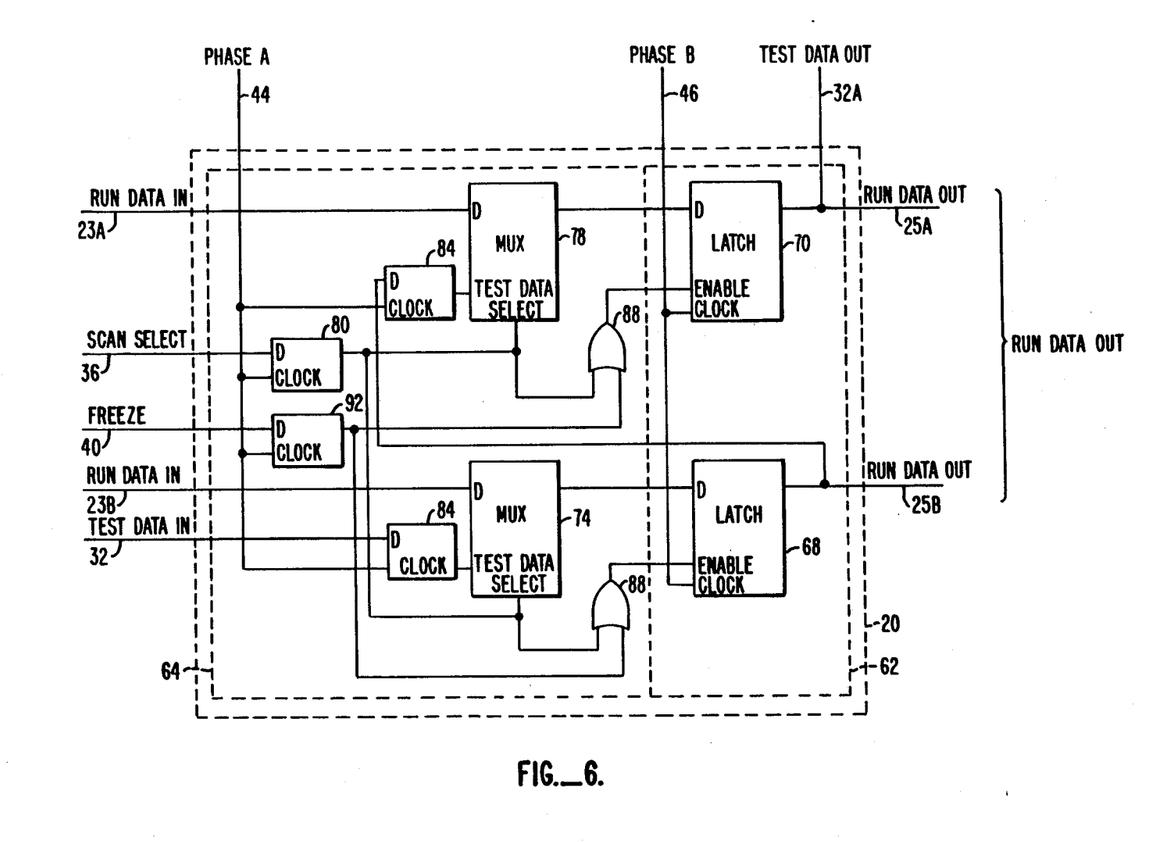
FIG. 6 is a detailed block diagram of the level sensitive scan, unit, of FIG. 2.

FIG. 6 is a detailed diagram of level sensitive scan unit 20 illustrating how the latches of FIGS. 4 and 5 may be configured to produce an operative system. Since all scan units in the scan chain are constructed the same, only details of scan unit 20 shall be discussed.

Level sensitive scan unit 20 comprises a latch section 62 and a control section 64. Latch section 62 comprises a first freezable data latch 68 and a second freezable data latch 70. Although two data latches 68 and 70 have been illustrated, any number of data latches may be included in a level sensitive scan unit 20, depending on system requirements. Latches 68 and 70 communicate run data on lines 23A and 23B of bus 23 to lines 25A and 25B of bus 25 during normal system operation, and they communicate data from line 32 to a line 32A when in test mode. Both latches 68 and 70 have their enable inputs connected for receiving phase B pulses on line 46.

Control section 64 comprises a first multiplexer 74 and a second multiplexer 78. Each multiplexer 74 and 78 has a select input terminal connected to scan select line 36 through a conventional latch 80 termed a select latch, for selecting whether run data or test data shall be input to latches 68 and 70, respectively, depending on first and second signals received on scan select line 36. Select latch 80 has its clock input terminal connected for receiving phase A pulses over line 44.

To prevent test data appearing on line 32 from propagating uncontrollably through latches 68 and 70 when multiplexers 74 and 78 are enabled for test operation (as a result of the common phase B enable signals), a conventional latch 84, termed a test data latch, is disposed between the data output of first data latch 68 and the test data input of multiplexer 78. A test data latch 84 also is disposed between the test data input line 32 and the test data input terminal of multiplexer 74. Both test data latches 84 have their enable input terminals connected for receiving phase A pulses over line 44.

To inhibit operation of data latches 68 and 70, and to maintain the data existing on lines 25A and 25B of bus 25 at a particular time, each data latch 68 and 70 has its enable input terminal connected to freeze line 40 through an OR gate 88 and a conventional latch 92, termed a freeze latch. Freeze latch 92 has its clock input terminal connected for receiving phase A pulses on line 44.

During normal operation, a low signal is applied to scan select line 36, and a low signal is applied to freeze line 40. Run data on lines 23A and 23B then is transferred in parallel through data latches 68 and 70 to lines 25A and 25B upon each phase B pulse. In test mode, a high signal is applied to scan select line 36, and test data is provided to test data input line 32. When a phase A pulse is received by test data latches 84, the test data appearing on line 32 is communicated through multiplexer 74 to the input terminal of first data latch 68. Simultaneously, the data on the run data output line 25B of first data latch 68 is communicated through multiplexer 78 to the input terminal of second data latch 70. The test data then is shifted to test data output line 32A and to the input to test latch 84 of multiplexer 78 when data latches 68 and 70 receive a phase B pulse on line 46. The next bit of test data then is received by test latch 84 of multiplexer 74, and the process continues. Accordingly, the test data flows from test data input line 32 through multiplexer 74, first data latch 68, multiplexer 78, second data latch 70, and to test data output line 34.

It may be desirable to supply a phase A pulse train to latch section 62 and a phase B pulse train to control section 64. Because of this possibility, two categories of level sensitive scan units may be utilized to form a scan chain. In order to clarify the relationship of latches within a scan chain, the convention noted in FIGS. 7a14 7c and 8a–8c shall be used.

Figure 7A:
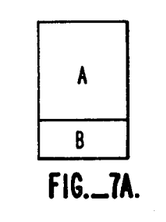
FIGS. 7a, 7b and 7C are block diagrams of a phase A scan unit, a phase A conventional latch and a phase A freezable latch, respectively, according to the present invention.
Figure 7B:
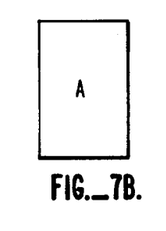
Figure 7C:
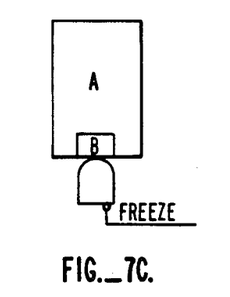
Figure 8A:
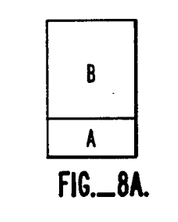
FIGS. 8a, 8b and 8C are block diagrams of a phase B scan unit, a phase B conventional latch and a phase B freezable latch, respectively, according to the present invention.
Figure 8B:
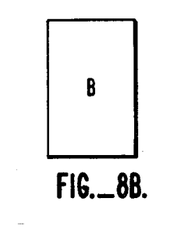
Figure 8C:
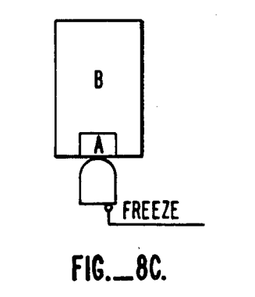
Figure 9:
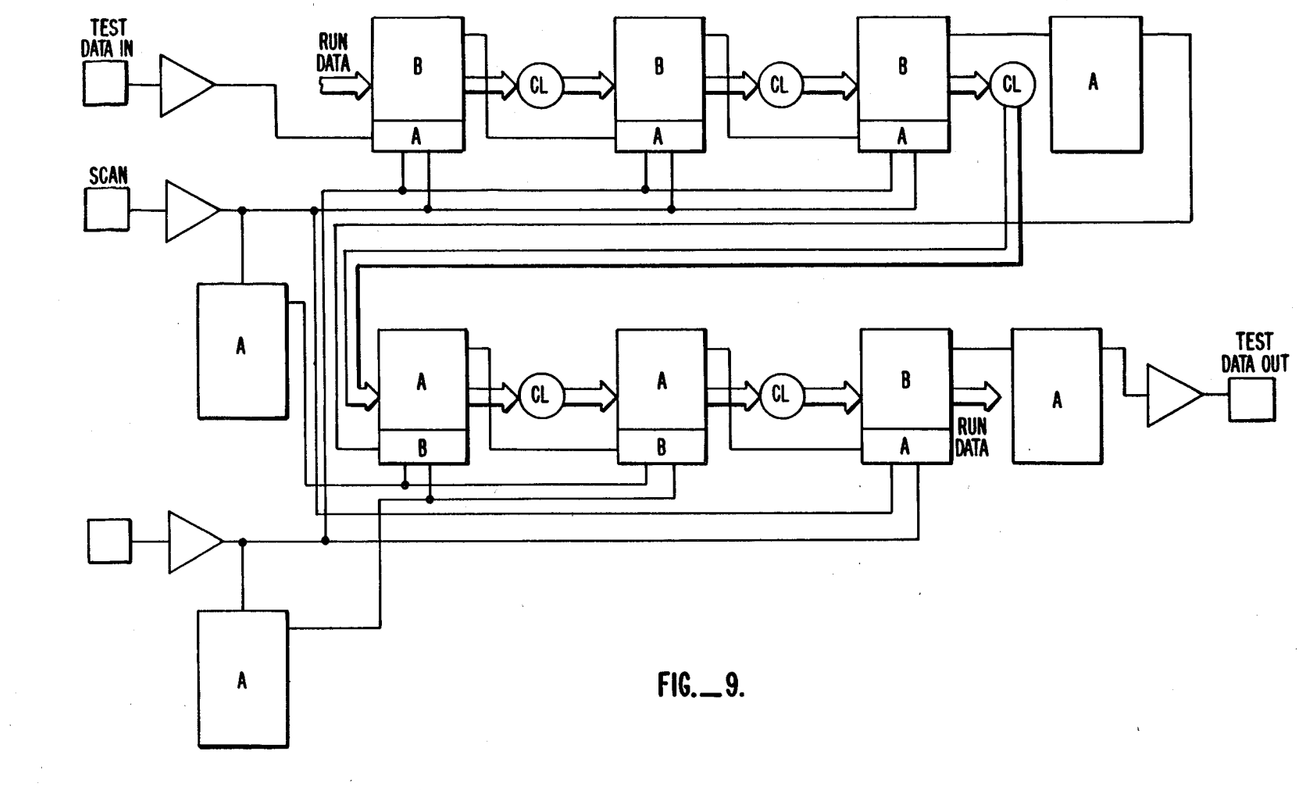
FIG. 9 is a block diagram of a chip level scan path according to the present invention.

FIG. 7a depicts a "Phase A" scan unit wherein the latch section of a scan unit receives a phase A pulse train and the control section of the scan unit receives a phase B pulse train. FIG. 7b depicts a "phase A" conventional latch whose loading is enabled by a phase A pulse train. FIG. 7c depicts a "phase A" freezable latch enabled by a phase A pulse train and inhibited by a signal applied to a freeze line. A phase B conventional latch is disposed on the enable input terminals of the latch for timing purposes. Similarly, FIG. 8A depicts a "Phase B" scan unit wherein the latch section of a scan unit receives a phase B pulse train and the control section of the scan unit receives a phase A pulse train (thus, scan unit 20 is a phase B scan unit). FIG. 8B depicts a "Phase B" conventional latch whose loading is enabled by a phase B pulse train. FIG. 8c depicts a "phase B" freezable latch enabled by a phase B pulse train and inhibited by a signal applied to a freeze line. A phase A conventional latch is disposed on the enable input terminals of the latch for timing purposes. A generic system illustrating the use of both phase A and phase B scan units is illustrated in FIG. 9.

Figure 10:
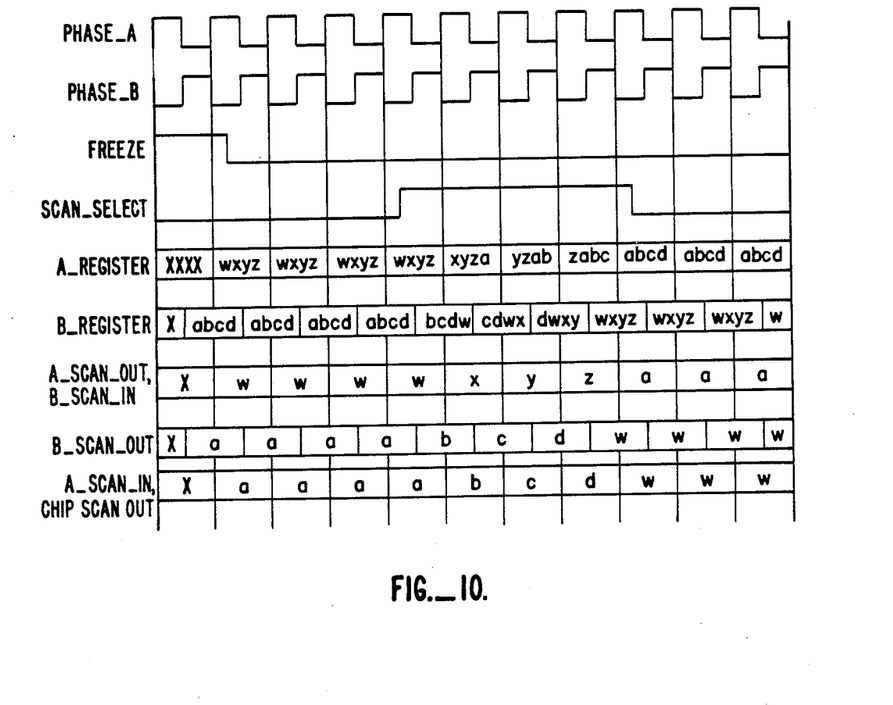
FIG. 10 is a block level and timing diagram illustrating the use of a phase A conventional latch disposed between a phase B scan unit and a phase A scan unit.

In general, a scan chain of phase B scan units can be hooked up directly without any additional logic. However, if a design includes phase A scan units, then an additional phase A latch must be placed between any phase B scan unit which feeds the scan input of a phase A scan unit as shown in FIG. 9. This is necessary so that bits are not lost as a result of the data on the test data output of the phase B scan unit propagating immediately through the phase B control section of the phase A scan unit before the phase A scan unit is able to transfer the data originally appearing at its test data input line into the scan unit. This occurs as a result of the scan select signal preferably going high during the phase A pulse, causing the output of the phase B scan unit to change before the phase A scan unit stores the previous phase B scan unit output. This phenomenon may be more readily understood by referring to the timing diagram of FIG. 10.

Figure 11:
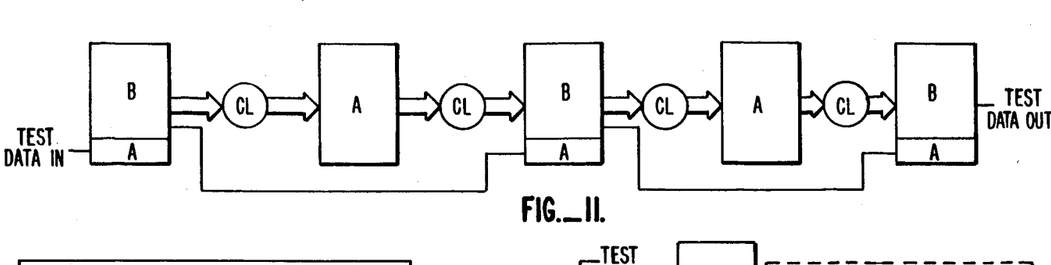
FIG. 11 is a block diagram illustrating the use of phase A conventional latches alternating with phase B scan units.

A significant benefit of using scan units according to the present invention is that, unlike prior art systems, not every latch in the system needs to be converted into a scan unit. To realize a substantial cost saving, some or all scan units of a particular phase may be replaced with conventional or freezable latches having the same phase as shown in FIG. 11. In FIG. 11, every phase A scan unit has been replaced by a phase A conventional latch. Although the system loses a small amount of observability, controllability is not affected because the state of each phase A latch is determined by the contents of the phase B scan unit which precedes it. To preserve the sequential nature of the system, however, each phase A conventional latch must alternate with a phase B scan unit.

Figure 12:
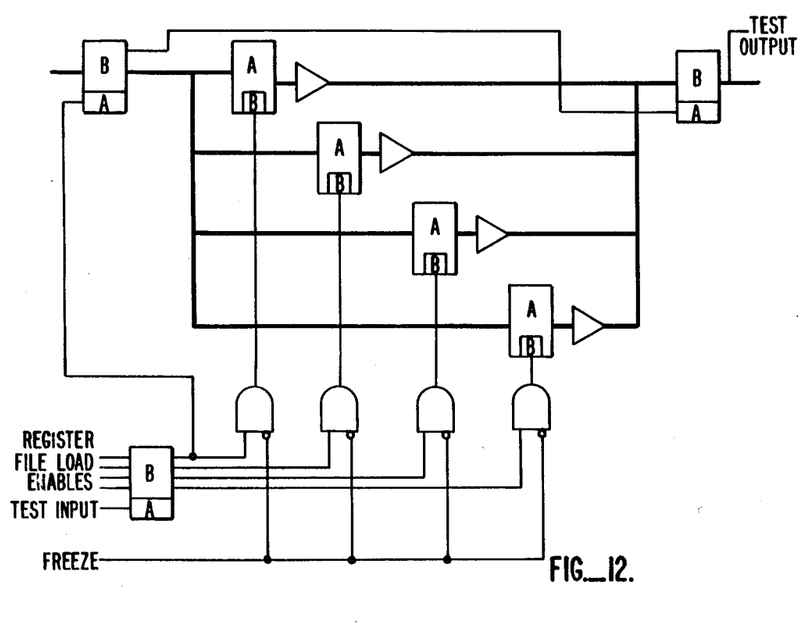
FIG. 12 is a block diagram illustrating the use of a freezable phase A latch when the latch controls receive their inputs from a phase B scan unit.

At times the conversion of all phase A latches into conventional latches is unacceptable due to the logic flow or the overhead of phase A scannable latches. An example of this would be a register file in which there are many phase A latches which the logic function requires to be gated. The structure for such a register file is outline in FIG. 12a. Using gated, non-scannable latches does reduce observability and controllability. But, if only the phase A latches are used in this manner then each gated phase A latch can be observed and controlled via:

(1) Having the load control of the phase A gated by the freeze signal.
(2) Having unique pattern of scannable data which can be put into the scannable latches of the system, so that when the machine is clocked for a single cycle in the run mode, the contents of a selected gated phase A latch may be read from or written to a scannable latch.

Figure 13:
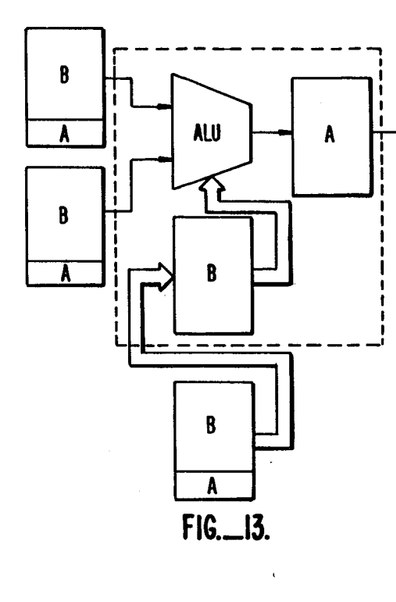
FIG. 13 is a block diagram illustrating the use of a phase B scan unit preceding an imbedded conventional phase B latch.

Occasionally, the circuit designer is confronted with a conventional latch embedded within a component, e.g., an ALU. If the embedded conventional latch is a phase B conventional latch, then such a latch violates the rules of the present system wherein all phase B conventional latches are replaced by phase B scan units. Nevertheless, the rule may be satisfied by preceding the embedded phase B conventional latch with a phase B scan unit as shown in FIG. 13. The phase B scan unit restores observability and controllability to the system but does not affect the operation of the system because both the embedded phase B conventional latch and the phase B scan unit will allow the control signals to pass through them during the phase B clock pulse.

Figure 14:
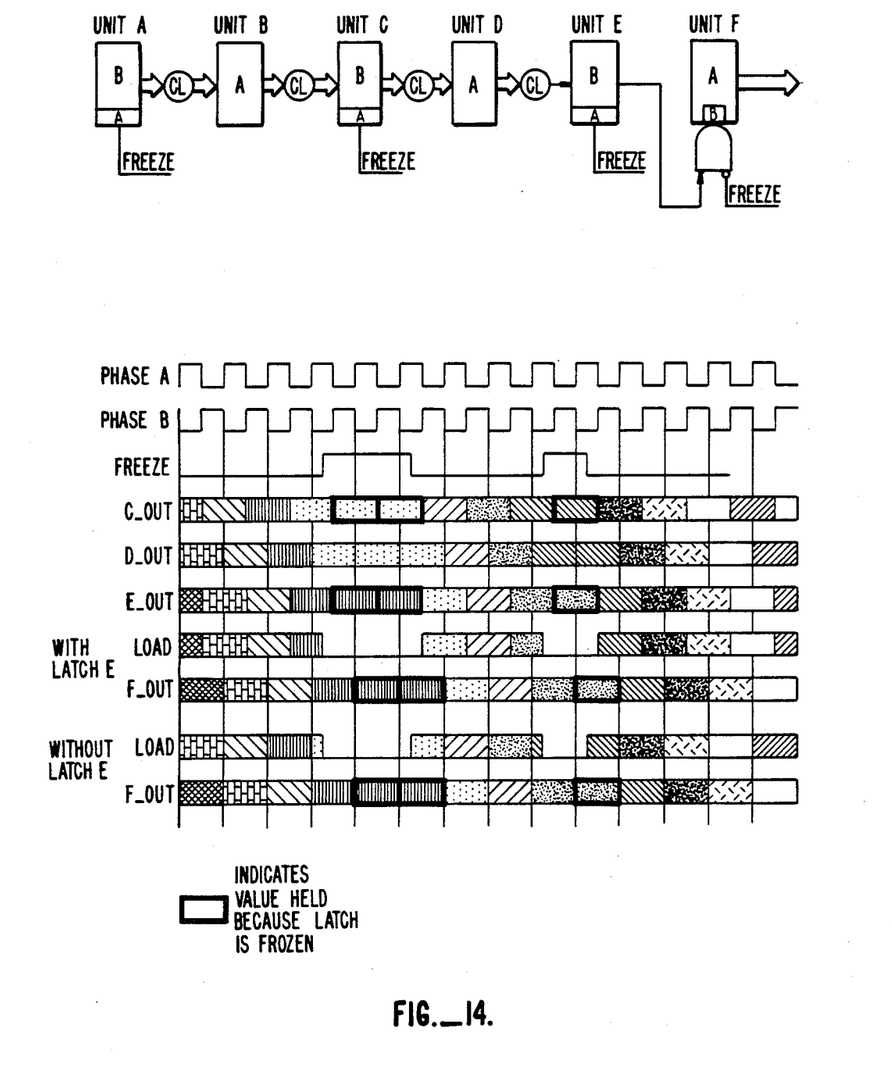
FIG. 14 is a block level and timing diagram illustrating the redundancy of using a phase B scan unit preceding the embedded conventional phase B latches in the control section of a phase A scan unit.

There is an exception to the foregoing requirement of using a phase B scan unit preceding an embedded phase B conventional latch. The conventional phase B latches in the control section of a phase A scan unit need not be preceded by a phase B scan unit. This is illustrated in FIG. 14.

Figure 15:
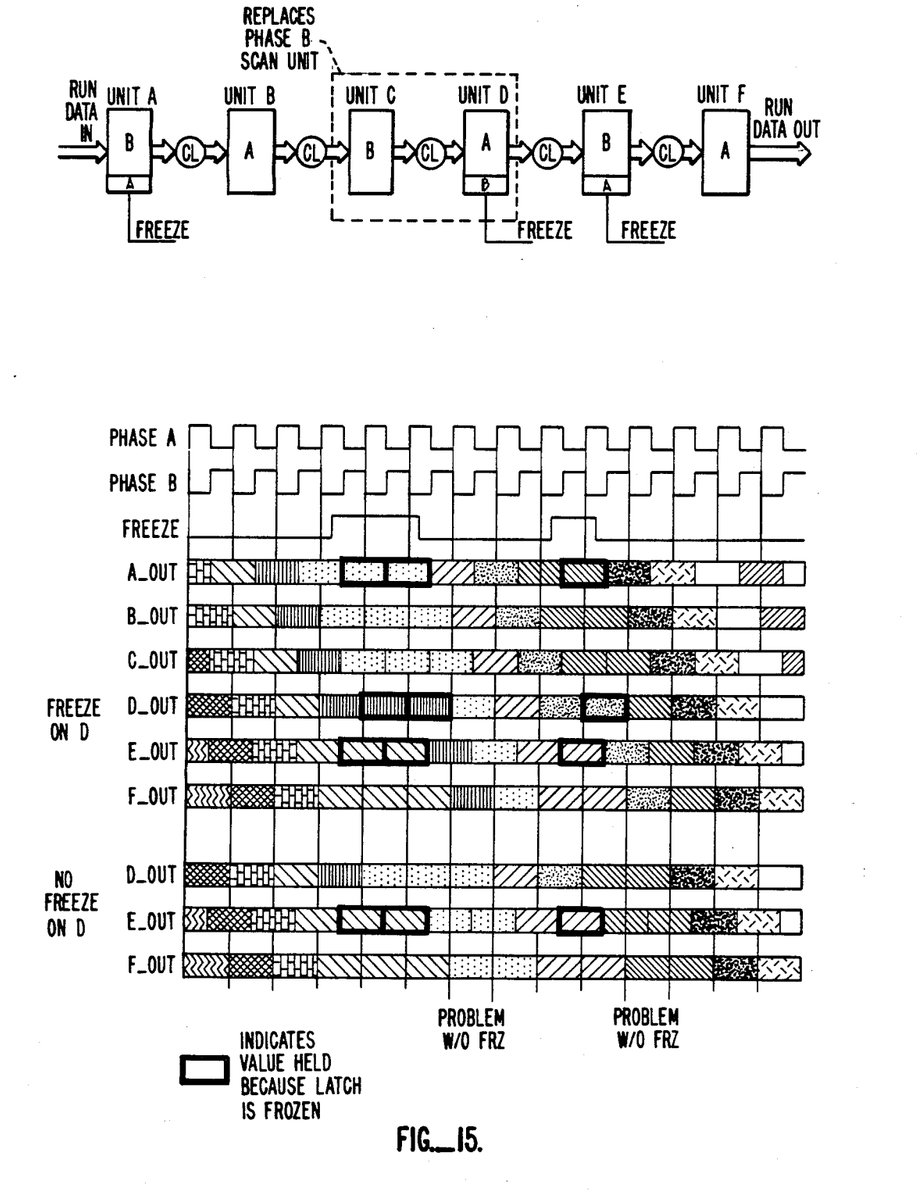
FIG. 15 is a block level and timing diagram illustrating the replacement of a phase B scan unit with a phase B conventional latch followed by a phase A scan unit.

Finally, if it is not desirable to use a phase B scan unit at a particular point in the circuit, the phase B scan unit may be replaced by a phase B conventional latch followed by a freezable phase A latch or a phase A scan unit. This is illustrated in FIG. 15.

While the above is a complete description of a preferred embodiment of the present invention, various modifications are obvious to those skilled in the art. Consequently, the description should not be used to limit the scope of the invention, which is properly described in the claims.

We claim:

1. A diagnostic apparatus for a plurality of combinational logic elements in a data processing system comprising:
   enable input means for receiving a continuous periodic enable signal;
   a plurality of scan units connected to an associated plurality of combinational logic elements, each scan unit comprising:
   a plurality of run data level sensitive elements connected to the enable input means, each run data level sensitive element including means for transferring combinational logic signals from an input terminal to an output terminal thereof in response to the enable signal; and
   multiplexing means, connected to each run data level sensitive element, for selectively communicating signals from an output terminal of a first run data level sensitive element to the input terminal of a second run data level sensitive element so that signals are serially communicated through the first and second level sensitive elements in response to the enable signal.

2. The diagnostic apparatus according to claim 1, wherein an input terminal of a first run data level sensitive element of a first scan unit is connected for recevving signals from an output terminal of a second run data level sensitive element of a second scan unit.

3. The diagnostic apparatus according to claim 1 wherein the multiplexing means selectively communicates signals from a combinational logic element to an input terminal of an associated run data level sensitive element.

4. The diagnostic apparatus according to claim 3 wherein the enable input means comprises:
   a first pulse input means for receiving a first continuous pulse train, the first pulse train being termed a phase A pulse train; and
   a second pulse input means for receiving a second continuous pulse train, the second pulse train being termed a phase B pulse train, the pulses of the second pulse train being interleaved and nonoverlapping with the pulses of the first pulse train, and each positive pulse of the first pulse train alternating with each positive pulse of the second pulse train.

5. The diagnostic apparatus according to claim 4 wherein the run data level sensitive elements are latches, termed run data latches.

6. The diagnostic apparatus according to claim 6 wherein the run data latches are connected to the second pulse input means.

7. The diagnostic apparatus according to claim 6 wherein the test data level sensitive element is a latch, termed a test data latch.

8. The diagnostic apparatus according to claim 7 wherein the test data latch is connected to the first pulse input means for communicating the signals from the first run data latch to the multiplexing means in response to the first pulse signals.

9. The diagnostic apparatus according to claim 8 wherein the multiplexing means includes a select input terminal for receiving first and second selection signals from a selection signal source, the multiplexing means communicating the signal from the output terminal of the first run data latch to the input terminal of the second run data latch in response to the first selection signal, and the multiplexing means communicating the signal from the combinational logic element to the input terminal of the associated run data latch in response to the second selection signal.

10. The diagnostic apparatus according to claim 9 further comprising a select level sensitive element connected to the enabling means, to the selection signal source and to the select input terminal, for communicating the selection signal to the select input terminal in response to the enable signal.

11. The diagnostic apparatus according to claim 10 wherein the selection level sensitive element is a latch, termed a select latch.

12. The diagnostic apparatus according to claim 11 wherein the select latch is connected to the first pulse input means.

13. The diagnostic apparatus according to claim 12 wherein the first and second run data latches include a freeze terminal for receiving freeze signals from a freeze source, the first and second data latches maintaining a prescribed signal at their respective output terminals in response to the freeze signal.

14. The diagnostic apparatus according to claim 13 further comprising a freeze level sensitive element connected to the freeze source, to the freeze terminal, and to the enable input means, for communicating the freeze signal to the freeze terminal in response to the enable signal.

15. The diagnostic apparatus according to claim 14 wherein the freeze level sensitive element is a latch, termed a freeze latch.

16. The diagnostic apparatus according to claim 15 wherein the freeze latch is connected to the first pulse input means.

17. The diagnostic apparatus according to claim 1 further comprising a test data level sensitive element connected to the enable input means, to the multiplexer, and to the output terminal of the first run data level sensitive element, for communicating the signals from the first run data level sensitive element to the multiplexing means in response to the enabling signal.

18. A diagnostic apparatus for a plurality of combinational logic elements in a data processing system comprising:
   a first pulse input means for receiving a first continuous pulse train, the first pulse train being termed a phase A pulse train;
   a second pulse input means for receiving a second continuous pulse train, the second pulse train being termed a phase B pulse train, the pulses of the second pulse train being interleaved and nonoverlapping with the pulses of the first pulse train, and each positive pulse of the first pulse train alternating with each positive pulse of the second pulse train;
   a phase A scan unit connected to an associated combinational logic element comprising:
      a plurality of phase A run data latches connected to the first pulse input means, each phase A run data latch including means for transferring signals from an input terminal to an output terminal thereof in response to the phase A pulses;
   first multiplexing means, connected to each phase A run data latch, for:
      (1) selectively communicating signals from an output terminal of a first phase A run data latch to the input terminal of a second phase A run data latch in response to a first multiplexing signal so that signals are serially communicated through the first and second phase A run data latches in response to the phase A pulses;
      (2) selectively communicating a plurality of signals from a combinational logic element to an associated plurality of input terminals of an associated phase B run data latch in response to a second multiplexing signal so that the combinational logic signals are communicated in parallel from the combinational logic element through the first and second phase A run data latches in response to the phase A pulses;
   a phase B scan unit connected to an associated combinational logic element comprising:
      a plurality of phase B run data latches connected to the second pulse input means, each phase B run data latch including means for transferring signals from an input terminal to an output terminal thereof in response to the phase B pulses;
   second multiplexing means, connected to each phase B run data latch for:
      (1) selectively communicating signals from an output terminal of a first phase B run data latch to the input terminal of a second phase B run data latch in response to a third multiplexing signal, so that signals are serially communicated through the first and second phase B run data latches in response to the phase B pulses;
      (2) selectively communicating a plurality of signals from a combinational logic element to an associated plurality of input terminals of an associated phase B run data latch in response to a fourth multiplexing signal so that the combinational logic signals are communicated in parallel from the combinational logic element through the first and second phase B run data latches in response to the phase B pulses.

19. The diagnostic apparatus according to claim 18, wherein an input terminal of a first phase A run data latch of a phase A scan unit is connected for receiving signals from an output terminal of a second phase B run data latch of a phase B scan unit.

20. The diagnostic apparatus according to claim 19, wherein an input terminal of a first phase B run data latch of a phase B scan unit is connected for receiving signals from an output terminal of a second phase A run data latch of a phase A scan unit.

21. The diagnostic apparatus according to claim 19 further comprising:
   a conventional latch disposed between the output terminal of the second phase B latch and the input terminal of the first phase A latch, the conventional latch being connected to the first input means for communicating signals from the output terminal of the second phase B latch to the input terminal of the first phase A latch in response to the phase A pulses.

22. A diagnostic apparatus for a plurality of combinational elements in a data processing system comprising:
   a first pulse input means for receiving a first continuous pulse train, the first pulse train being termed a phase A pulse train;
   a second pulse input means for receiving a second continuous pulse train, the second pulse train being termed a phase B pulse train, the pulses of the phase B pulse train being interleaved and nonoverlapping with the pulses of the phase A pulse train, and each positive pulse of the phase B pulse train alternating with each positive pulse of the phase A pulse train;
   a phase A run data latch connected to an associated combinational logic element and to the first pulse input means for communicating signals from a combinational logic element to an output terminal of the phase A run data latch in response to every pulse in the phase A pulse train;
   a phase B scan unit connected to an associated combinational logic element comprising:
      a plurality of phase B run data latches connected to the second pulse input means, each phase B run data latch including means for transferring signals from an input terminal to an output terminal thereof in response to the phase B pulses;
   multiplexing means, connected to each phase B run data latch for:
      (1) selectively communicating signals from an output terminal of a first phase B run data latch to the input terminal of a second phase B run data latch in response to a first multiplexing signal, so that signals are serially communicated through the first and second phase B run data latches in response to the phase B pulses;
      (2) selectively communicating a plurality of signals from a combinational logic element to an associated plurality of input terminals of an associated phase B run data latch in response to a second multiplexing signal so that the combinational logic signals are communicated in parallel from the combinational logic element through the first and second phase B run data latches in response to the phase B pulses.

23. The diagnostic apparatus according to claim 22, further comprising means for selectively inhibiting the communication of signals from a combinational logic element to an output terminal of a phase A run data latch.

24. The diagnostic apparatus according to claim 23, wherein the inhibiting means is connected to an output terminal of a phase B scan unit.

25. The diagnostic apparatus according to claim 22, further comprising:
- a phase B run data latch connected to an associated combinational logic element and to the second pulse input means for communicating signals from an input terminal to an output terminal of the phase B run data latch and to the combinational logic in response to every pulse in the phase B pulse train;
- wherein each input terminal of the phase B run data latch is connected for receiving signals from an associated output terminal of an associated phase B scan unit.

26. A diagnostic apparatus for a plurality of combinational elements in a data processing system comprising:
- a first pulse input means for receiving a first continuous pulse train, the first pulse train being termed a phase A pulse train;
- a second pulse input means for receiving a second continuous pulse train, the second pulse train being termed a phase B pulse train, the pulses of the phase B pulse train being interleaved and nonoverlapping with the pulses of the phase A pulse train, and each positive pulse of the phase B pulse train alternating with each positive pulse of the phase A pulse train;
- a phase A run data latch connected to an associated combinational logic element and to the first pulse input means for communicating a signal from a combinational logic element to an output terminal of the phase A run data latch in response to every pulse in the phase A pulse train;
- a phase B run data latch connected for receiving associated combinational logic element and to the second pulse input means for communicating a signal from a combinational logic element to an output terminal of the phase B run data latch in response to every pulse in the phase B pulse train;
- a phase A scan unit connected for receiving signals from the phase B run data latch comprising:
  - a plurality of phase A run data latches connected to the first pulse input means, each phase A run data latch including means for transferring signals from an input terminal to an output terminal thereof in response to the phase A pulses;
  - multiplexing means, connected to each phase A run data latch, for:
    (1) communicating signals from a first phase A run data latch to the input terminal of a second phase A run data latch in response to a first multiplexing signal, so that signals are serially communicated through the first and second phase A run data latches in response to the phase A pulses;
    (2) communicating the signals from the output terminal of the phase B run data latch to the input terminals of the first and second phase A run data latches in response to a second multiplexing signal so that the signals from the output terminals of the phase B run data latch are communicated in parallel through the first and second phase A run data latches in response to the phase A pulses.

* * * * *